(12) United States Patent
Sato et al.

(10) Patent No.: US 8,058,139 B2
(45) Date of Patent: Nov. 15, 2011

(54) MANUFACTURING METHOD FOR SEMICONDUCTOR DEVICES

(75) Inventors: Katsuhiro Sato, Yokohama (JP); Takahito Nakajima, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 138 days.

(21) Appl. No.: 12/392,584

(22) Filed: Feb. 25, 2009

(65) Prior Publication Data

US 2009/0215241 A1   Aug. 27, 2009

(30) Foreign Application Priority Data

Feb. 25, 2008   (JP) ................. P2008-043257

(51) Int. Cl.
*H01L 21/76* (2006.01)
(52) U.S. Cl. ................. 438/424; 257/E21.547
(58) Field of Classification Search .......... 438/424; 257/E21.547
See application file for complete search history.

(56) References Cited

U.S. PATENT DOCUMENTS

| | | | |
|---|---|---|---|
| 5,747,623 A | 5/1998 | Matsuo et al. | |
| 2005/0026443 A1 | 2/2005 | Goo et al. | |

FOREIGN PATENT DOCUMENTS

| | | |
|---|---|---|
| CN | 1257529 A | 6/2000 |
| JP | 7-2511 | 1/1995 |
| JP | 08-112879 A | 5/1996 |
| JP | 2001-89126 | 4/2001 |
| JP | 2001-308090 | 11/2001 |
| JP | 2002-367980 | 12/2002 |
| JP | 2004-273519 | 9/2004 |
| JP | 2004-363595 | 12/2004 |
| JP | 2005-45230 | 2/2005 |
| JP | 2005-116706 | 4/2005 |
| JP | 2006-222220 | 8/2006 |
| JP | 2006-253310 | 9/2006 |
| JP | 2007-27697 | 2/2007 |
| JP | 2007-165724 | 6/2007 |
| WO | WO 99/03926 A1 | 1/1999 |

*Primary Examiner* — Matthew Landau
*Assistant Examiner* — Sonya McCall Shepard
(74) *Attorney, Agent, or Firm* — Oblon, Spivak, McClelland, Maier & Neustadt, L.L.P.

(57) ABSTRACT

A polysilazane perhydride solution, prepared by dispensing polysilazane perhydride in a solvent containing carbon, is applied on a semiconductor substrate (1), thereby forming a coated film (6), which is heated, volatilizing solvent therein, thereby forming a polysilazane film (7), which is chemical-treated, so the polysilazane film (7) is changed to a silicon dioxide film (8).

7 Claims, 16 Drawing Sheets

MANUFACTURING METHOD FOR SEMICONDUCTOR DEVICES

CROSS REFERENCE TO RELATED APPLICATIONS

This application is based upon and claims the benefit of priority from prior Japanese Patent Application 2008-043257 filed on Feb. 25, 2008, the entire contents of which are incorporated herein by reference.

BACKGROUND OF THE INVENTION

1. Field of the Invention

The present invention relates to a manufacturing method for semiconductor devices.

2. Description of Related Art

Semiconductor devices have an STI (shallow trench isolation) structure widely used for isolation between microscopic elements. For the STI structure, associated processes include a step of forming a trench in a surface of a semiconductor substrate, and a step of embedding an insulation film (element isolating insulation film) in the trench. The insulation film embedded in trench may be a film of a silicon oxide, such as silicon dioxide ($SiO_2$), for instance. For formation of the silicon oxide film, there are known processes including, among others, a CVD (chemical vapor deposition) process employing a source gas containing ozone ($O_3$) and TEOS (tetraethoxysilane), HDP (high-density plasma) CVD process, and the like.

Along with miniaturization of semiconductor device, trenches have an increased aspect ratio (trench depth/trench width). It therefore is becoming difficult for the above-noted CVD process or the like to form a silicon oxide film in a trench without producing voids (unfilled part) or seams (joint-like unfilled part). That is, for STI applications, it is getting difficult to make a silicon oxide film with a favorable embedded form.

In this respect, for miniature semiconductor elements from the 100-nm generation, there have been proposals for a process employing a coating type solution SOG (spin-on-grass).

Typically, silicon hydroxide (silanol $SiOH_4$) is dispersed in an organic solvent, such as alcohol, to obtain a solution (silicon hydroxide solution) as an SOG solution to be employed.

This silicon hydroxide solution is applied on a semiconductor substrate, thereby forming a coated film on the semiconductor substrate. After that, the coated film is heated, thereby developing hydrolysis and dehydrating condensation reactions. The coated film is thereby changed to a silicon dioxide film.

Along the course of hydrolysis and dehydrating condensation reactions, significant volume shrinkage develops. As a result, cracks occur in silicon oxide film in the trench. In other words, for STI applications, it is getting difficult to make a silicon dioxide film with a favorable embedded form, even in employment of silicon hydroxide solution.

To this point, among solutions for SOG application, there is a solution containing polysilazane perhydride (polysilazane perhydride solution) that has a relatively small volume shrinkage, which is attracting attention in recent years. Methods being employed include applying the polysilazane perhydride solution on a semiconductor substrate, so as to refill trenches formed in the semiconductor substrate, which is followed by an oxidation treatment in a water vapor atmosphere to thereby form a silicon dioxide film as an element isolating insulation film.

More specifically, polysilazane perhydride (($SiH_2NH)_n$) is dispersed in, among others, xylenen ($C_6H_4(CH_3)_2$) or dibutyl ether (($C_4H_9)_{2O}$) or such, thereby forming the polysilazane perhydride solution.

The polysilazane perhydride solution is applied on a surface of a semiconductor substrate, so as to refill trenches formed therein, by a spin coating method (that is the method of spinning a semiconductor substrate, coating with a solution). Resultant coat of polysilazane perhydride solution undergoes a thermal treatment (baking treatment), whereby solvent of polysilazane perhydride solution is volatilized to form a film of polysilazane (referred herein to as "PSZ"). After that, the PSZ film is treated for oxidation to form a silicon dioxide film.

Silicon dioxide films after the oxidation treatment have remaining impurities including, among others, nitrogen (N) contained in the structure of PSZ, and carbon (C) having been contained in a solvent of polysilazane perhydride solution. Such remaining N (nitrogen) and C (carbon) in silicon dioxide film may act as positive bound charges, affecting electrical characteristics and integrity of the semiconductor device.

To this point, there is a technique proposed in Japanese Patent Application Laid-Open Publication No. 2006-222220, in which for a semiconductor substrate formed with a PSZ film and inserted in a diffusion furnace, pressure in the furnace is once dropped, and then water vapor is introduced, thereby raising the furnace pressure, while an oxidation treatment is performed therealong, thereby depriving the PSZ film of impurities such as N (nitrogen) and C (carbon), to change the PSZ film into a silicon dioxide film.

The technique proposed in Japanese Patent Application Laid-Open Publication No. 2006-222220 permits a silicon dioxide film to be formed as an element isolating insulation film with a reduced content of impurities, whereto it has been a desideratum to provide a manufacturing method for semiconductor devices permitting an element isolating insulation film to be formed with the less content of impurity, allowing for unaffected electrical characteristics and integrity.

SUMMARY OF THE INVENTION

The present invention has been devised in view of the foregoing points, and it is an objective of the present invention to provide a manufacturing method for semiconductor devices allowing for unaffected electrical characteristics and integrity of semiconductor devices.

According to an aspect of the present invention, a manufacturing method for semiconductor devices comprises forming a trench in a semiconductor substrate, applying on the semiconductor substrate polysilazane perhydride solution prepared by dispesing polysilazane perhydride in a solvent containing carbon, having a coated film formed thereon, heating the coated film, volatilizing solvent therein, forming a polysilazane film, chemical-treating the polysilazane film, changing the polysilazane film to a silicon oxide film, and heating the silicon oxide film, densifying the silicon oxide film.

According to another aspect of the present invention, a manufacturing method for semiconductor devices comprises forming a trench in a semiconductor substrate, applying on the semiconductor substrate polysilazane perhydride solution prepared by dispesing polysilazane perhydride in a solvent containing carbon, having a coated film formed thereon, heating the coated film, volatilizing solvent therein, forming a polysilazane film, oxidation-treating the polysilazane film, chemical-treating the polysilazane film as oxidation-treated, changing the polysilazane film to a silicon oxide film, and heating the silicon oxide film, densifying the silicon oxide film.

DETAILED DESCRIPTION OF THE PREFERRED EMBODIMENTS

There will be described the preferred embodiments of the present invention, with reference to the drawings.

Figure 1:
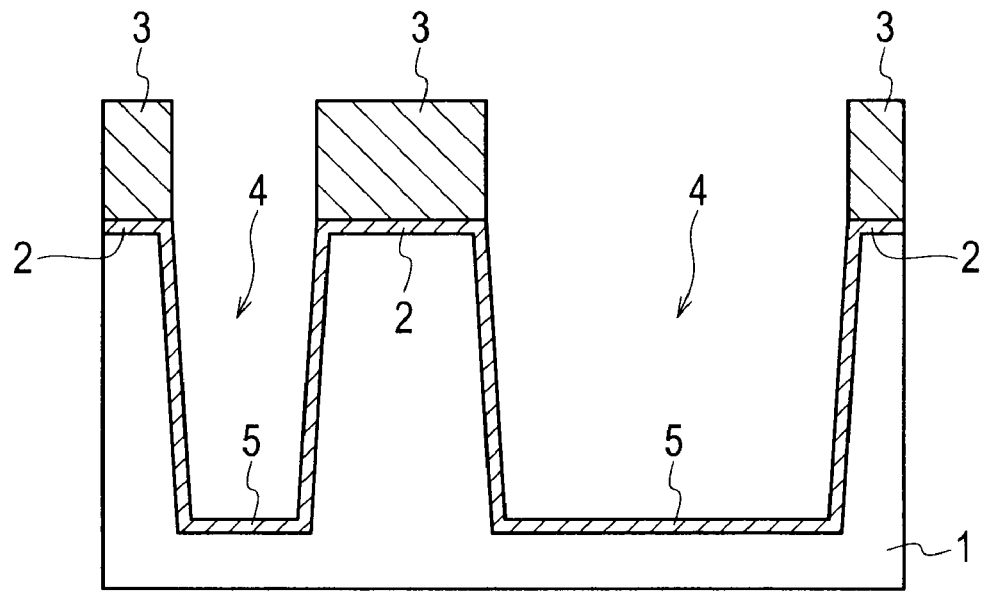
FIG. 1 is a sectional view of an essential portion of a work in a manufacturing method for semiconductor devices according to an embodiment of the present invention.
Figure 2:
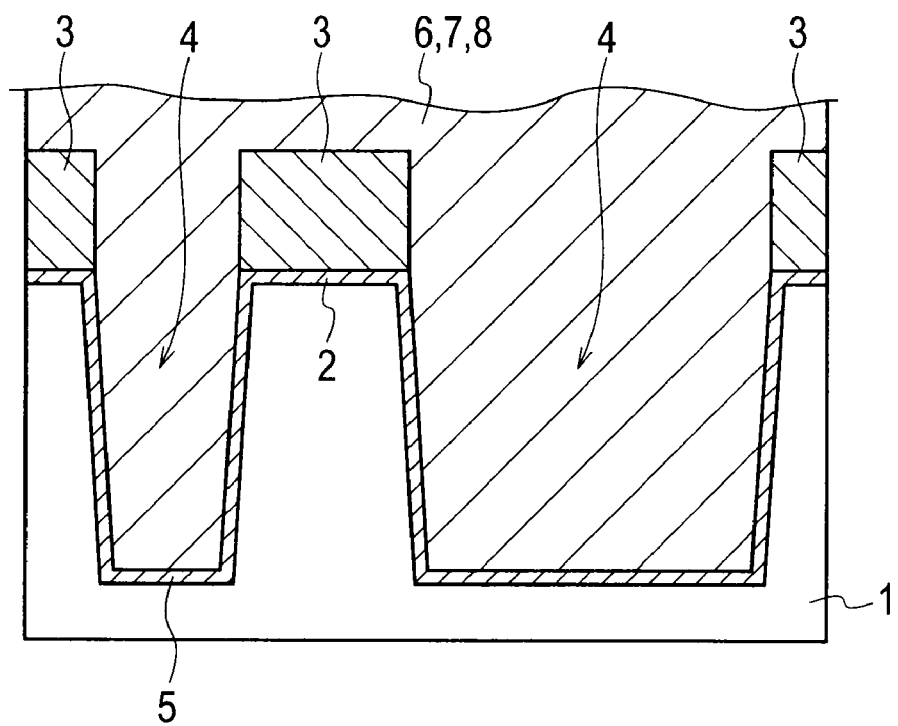
FIG. 2 is a sectional view of an essential portion of a work in the manufacturing method for semiconductor devices according to the embodiment.
Figure 3:
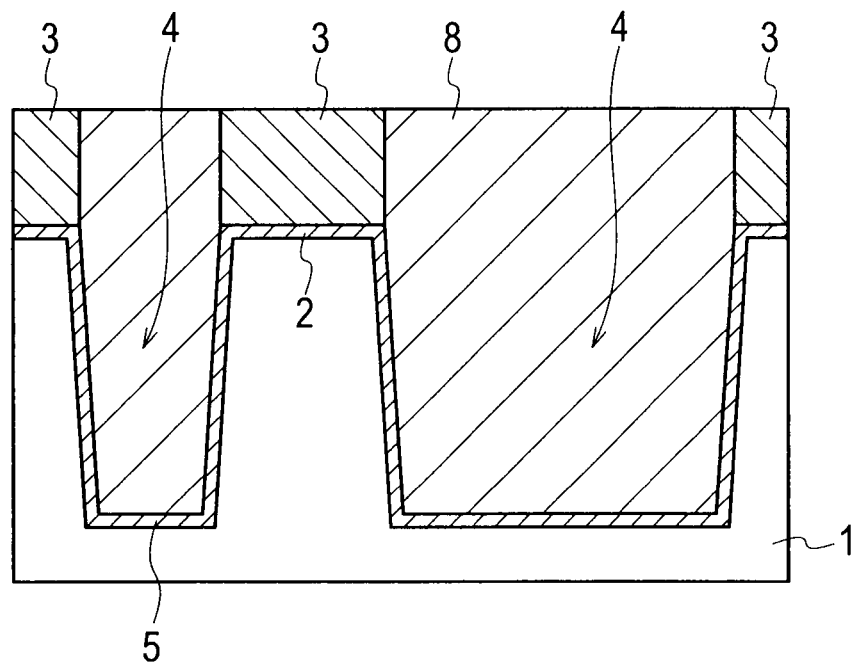
FIG. 3 is a sectional view of an essential portion of a work in the manufacturing method for semiconductor devices according to the embodiment.

FIG. 1 to FIG. 3 are sectional views of essential portions of works in a manufacturing method for semiconductor devices according to an embodiment of the present invention. Description is now made of a manufacturing method for semiconductor devices including a method of forming an element isolation region, for instance.

As illustrated in FIG. 1, a silicon substrate 1 first has a thermally oxidized film 2 formed thereon about 5 nm thick by a thermal oxidation method, and thereafter has an $Si_3N_4$ film 3 formed thereon by a CVD method, to constitute a stopper of polishing in a CMP (chemical mechanical polishing) method to be performed later. The $Si_3N_4$ film 3 is about 150 nm thick, for instance.

Next, the $Si_3N_4$ film 3 has a CVD oxidized film (not shown) formed thereon by a CVD method. The CVD oxidized film has a photoresist (not shown) coated thereon, and exposed and developed to thereby form a resist mask (not shown).

Then, by an RIE (reactive ion etching) employing the resist mask for a masking, a patterning is made to the CVD oxidized film, whereby a hard mask is formed. After that, the resist mask is removed by an asher (a device for removing resists in a vapor phase), and etching by a liquid mixture of sulfuric acid and hydrogen peroxide solution.

Then, by an RIE employing the hard mask for a masking, a patterning is made to the $Si_3N_4$ film 3, and thermally oxidized film 2. Further, employing that mask for a masking, an etching is made to the silicon substrate 1, whereby trenches 4 are formed. Those trenches 4 have a depth about 300 nm, for instance.

Next, using hydrofluoric acid vapor (vapor containing fluorinated acid), the hard mask is removed, and thereafter, trenches 4 have thermally oxidized films 5 formed on inside surfaces thereof by a thermal oxidation method. Those thermally oxidized films 5 have a thickness about 4 nm, for instance.

Next, polysilazane perhydride (($SiH_2NH)_n$) is dispersed in a solvent, such as xylene or dibutyl ether, whereby a polysilazane perhydride solution is prepared.

As illustrated in FIG. 2, complying with a spin coating method, spinning the silicon substrate 1, the polysilazane perhydride solution is applied on a surface of the silicon substrate 1, so as to refill trenches 4 formed in the surface, whereby a coated film 6 is formed.

Such being the case, the polysilazane perhydride solution being liquid is applied, whereby even such trenches 4 that have high aspect ratios can be free from formation of voids or seams therein, unlike using high-density plasma for their refilling.

In this case, the spin coating method is conditioned, for instance, for the silicon substrate 1, to a spinning speed of 4000 rpm, and a spin time of 30 seconds, for the polysilazane perhydride solution, to a dropping rate of 8 cc, and for the coated film 6, to an aiming film thickness about 500 nm.

Next, the silicon substrate 1 formed with the coated film 6 is placed on a hot plate, where the coated film 6 undergoes a thermal treatment by a baking (heating) about three minutes in an inert gas atmosphere under 200° C. (with 200° C. inclusive), e.g., 150° C., whereby a solvent in the polysilazane perhydride solution, such as xylene or dibutyl ether, is volatilized, and a PSZ film 7 is formed.

Next, the silicon substrate 1 formed with the PSZ film 7 is inserted in a diffusion furnace (not shown), where the PSZ film 7 undergoes an oxidation treatment about 30 minutes in a water vapor atmosphere over 200° C. and under 600° C. (with 600° C. inclusive), e.g., 300° C. There is a hydrolytic reaction developing, such that:

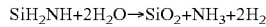

$$SiH_2NH + 2H_2O \rightarrow SiO_2 + NH_3 + 2H_2$$

The PSZ film 7 has a basic skeleton including Si—N bond group, Si—H bond group, and N—H bond group. By the hydrolytic reaction in the above-noted oxidation treatment, Si—N bond group or Si—H bond group is converted to Si—O bond group, whereby the PSZ film 7 is changed to a silicon dioxide film.

Figure 4:
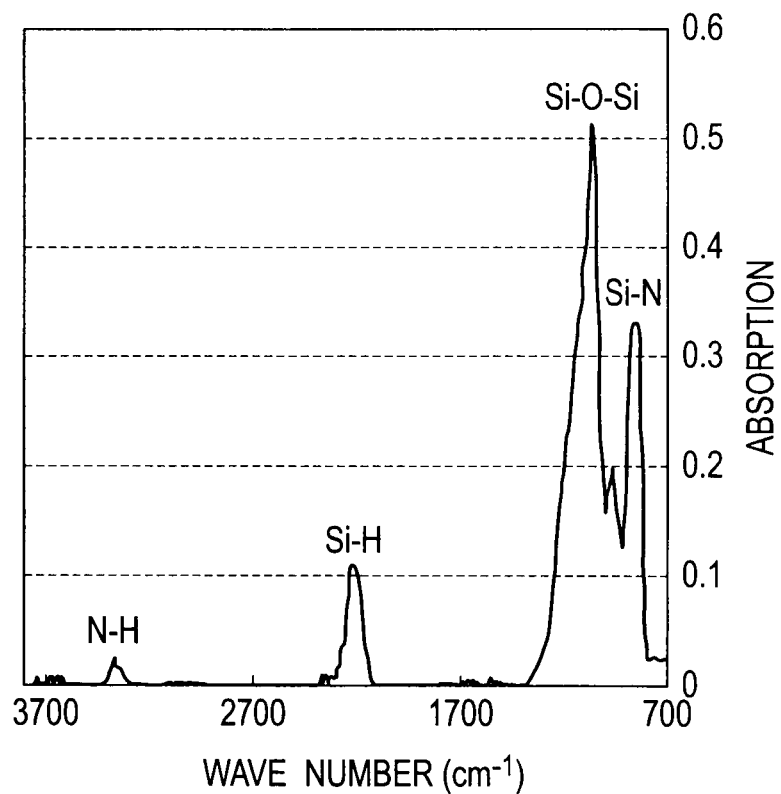
FIG. 4 is a spectral diagram showing a result of IR measurement of a PSZ film after oxidation treatment of work in the manufacturing method for semiconductor devices according to the embodiment.

However, at this stage, the PSZ film 7 is not changed yet to a complete silicon dioxide film. FIG. 4 is a spectral diagram showing a result of measurement by an infrared absorption spectrometry (IR) of a PSZ film 7 after oxidation treatment. As shown in FIG. 4, the PSZ film 7 after oxidation treatment has remaining N (nitrogen) included in the structure of PSZ, revealing that it is not yet a complete silicon dioxide film.

Further, the PSZ film 7 after oxidation treatment has remaining C (carbon) as impurities having been contained in a solvent of polysilazane perhydride solution.

Therefore, the PSZ film 7 is then chemical-treated for removal of impurities to reform the PSZ film 7 to a silicon dioxide film 8. The chemical treatment includes soaking the silicon substrate 1, as it is formed with a PSZ film 7, in a treatment liquid that contains water. Processing time for the chemical treatment may be about 30 minutes, for instance.

For the chemical treatment, the treatment liquid to be used may contain an acid, such as a phosphoric acid, a sulfuric acid, or a hydrochloric acid, for instance, and water. By such a treatment liquid also, the above-noted hydrolytic reaction develops, letting $NH_3$ be free in the PSZ film 7. In use of a treatment liquid containing an acid, this acid neutralizes free $NH_3$, allowing for effective removal of N as an impurity in the PSZ film 7.

Further, the treatment liquid to be used may be a treatment liquid containing a base, such as tetramethylammonium hydroxide, ammonia, or choline, for instance, and water. In use of a treatment liquid containing a base, this base promotes the above-noted hydrolytic reaction, diffusing free $NH_3$ outside the system, thereby allowing for efficient removal of N in the PSZ film 7.

Further, there may be a pre-treatment performed by using pure water (heated water), before entering a treatment using a treatment liquid containing acid or base and water. Soaking the PSZ film 7 in pure water makes the above-noted hydrolytic reaction develop, causing free $NH_3$ to diffuse outside the system, with a resultant reduction of N in the PSZ film 7. This is followed by treatment using a treatment liquid containing acid or base, which allows for the more efficient removal of N.

Further, there may be a combination of treatment using a treatment liquid containing an acid and treatment using a treatment liquid containing a base. This allows for still more efficient removal of N.

Further, in the above-noted chemical treatment, residual organic substances containing C are dissolved by heated water or disintegrated by acid or base, whereby also C as an impurity in the PSZ film 7 is removed.

It is noted that for the chemical treatment, the treatment temperature may preferably be set within a range of 25° C. to 160° C., or more preferably within a range of 65° C. to 120° C. To this point, undesirable is a lower temperature range than 25° C., where the reaction rate may slow, and an exceeding temperature range over 160° C., where the silicon dioxide film 8 may be etched.

The oxidation treatment performed in a water vapor atmosphere before the chemical treatment may be omitted, and the thermal treatment by a baking (heating) to the coated film 6 may be followed by the chemical treatment.

After removal of impurities by the chemical treatment, the silicon dioxide film 8 undergoes an annealing for 30 minutes in an atmosphere of water vapor or dry oxygen at a temperature of 900° C., for instance, whereby the silicon dioxide film 8 is densified.

Next, as illustrated in FIG. 3, employing a CMP method using the $Si_3N_4$ film 3 as a stopper, the silicon dioxide film 8 is polished to flatten the surface, so that the $Si_3N_4$ film 3 is exposed. Then, using a heated and hot phosphoric acid, the $Si_3N_4$ film 3 is removed from the place, where device elements are fabricated by using known processes, as necessary, to obtain a semiconductor device.

According to the embodiment described, provision of a chemical treatment permits N and C to be effectively removed as impurities, when changing a PSZ film 7 to a silicon dioxide film 8. This enables suppression of the degree by which electrical characteristics as well as integrity of semiconductor device are to be affected by impurities contained in the silicon dioxide film 8 constituting an element isolating insulation film.

EMBODIMENT EXAMPLES

There will be described specific examples of the embodiment of the present invention.

Embodiment Example 1

For PSZ films formed on silicon substrates and oxidation-treated in a water vapor atmosphere in accordance with the procedures described, there were chemical treatments made thereto, using a phosphoric acid for their treatment liquids containing acid. Treatment liquids used were five kinds prepared in advance to phosphoric acid concentrations of 16%, 41%, 60%, 75%, and 85% by weight, respectively. Treatment temperatures were 65° C., and treatment periods, 30 minutes.

Figure 5:
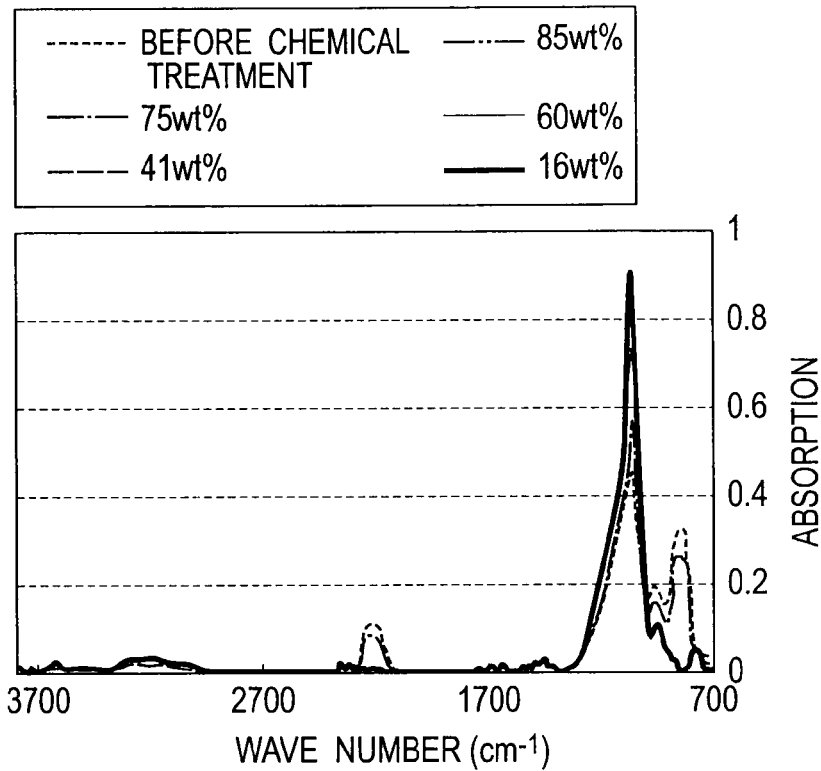
FIG. 5 is a spectral diagram showing FT-IR spectra of PSZ films after chemical treatments in an example 1 of the embodiment.
Figure 6:
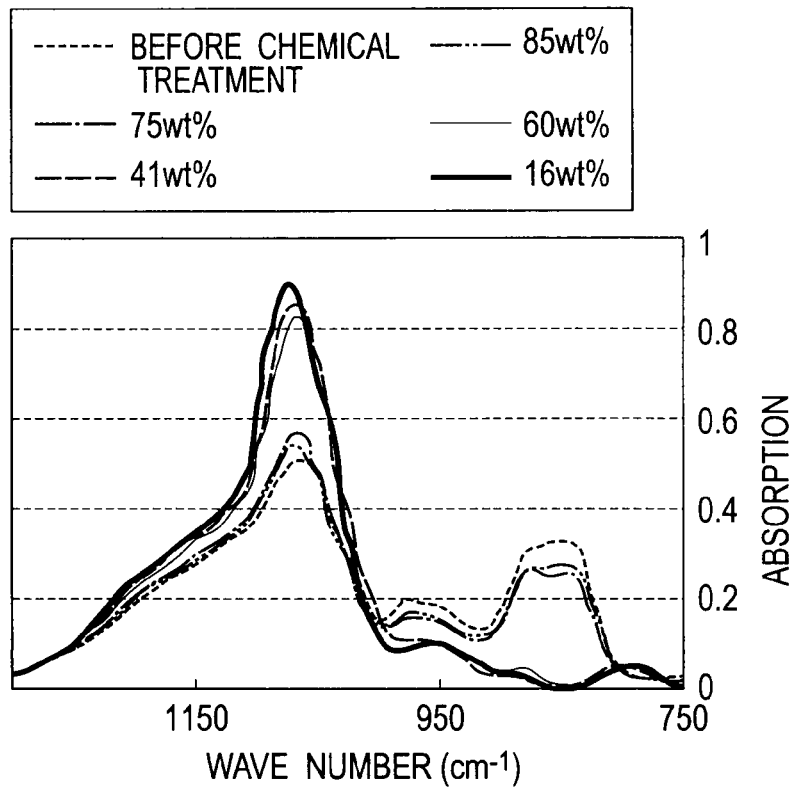
FIG. 6 is an enlarged view at a lower wave number side of the spectral diagram of FIG. 5.
Figure 7:
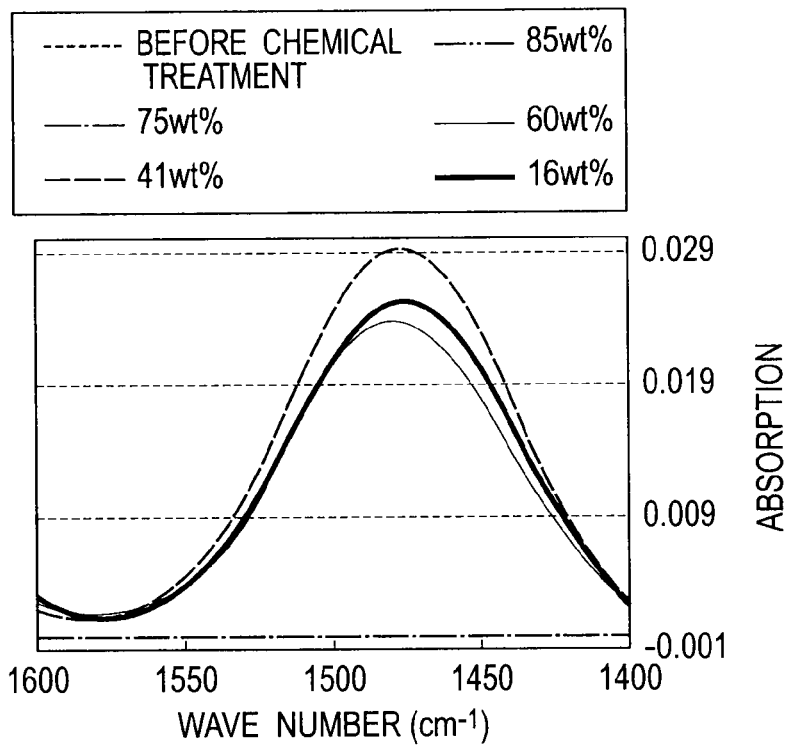
FIG. 7 is an enlarged view about a wave number of 1500 $cm^{-1}$ of the spectral diagram of FIG. 5.

FIG. 5 is a spectral diagram showing Fourier transform infrared (FT-IR) spectra of PSZ films after chemical treatments in the embodiment example 1, FIG. 6, an enlarged view at a lower wave number side of the spectral diagram of FIG. 5, and FIG. 7, an enlarged view about a wave number of 1500 $cm^{-1}$ of the spectral diagram of FIG. 5.

As shown in FIG. 5 and FIG. 6, for use of treatment liquid of any concentration, there were observed, in comparison with states before chemical treatment, i.e., after oxidation treatment, a decrease at a peak from vibration of Si—N, and an increase at a peak from vibration of Si—O—Si, indicating a progress of transition from PSZ to silicon dioxide.

Further, as in FIG. 7, there were observed peaks from vibration of $NH_3$ appearing about a wave number of 1500 $cm^{-1}$. This is an indication of $NH_3$ let to be free by a hydrolytic reaction, and free $NH_3$ diffused outside the system and neutralized by phosphoric acid, with a resultant removal of N being an impurity in PSZ film.

Embodiment Example 2

For PSZ films formed on silicon substrates and oxidation-treated in a water vapor atmosphere in accordance with the procedures described, there were chemical treatments made thereto, using a sulfuric acid for their treatment liquids containing acid. Treatment liquids used were five kinds prepared in advance to sulfuric acid concentrations of 17%, 44%, 64%, 81%, and 98% by weight, respectively. Treatment temperatures were 65° C., and treatment periods, 30 minutes.

Figure 8:
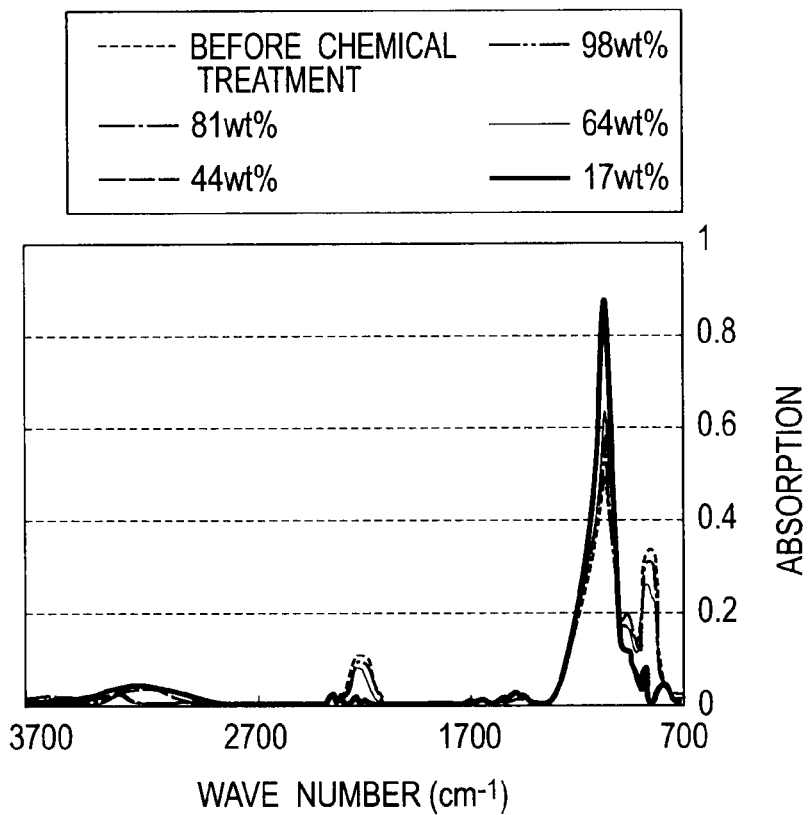
FIG. 8 is a spectral diagram showing FT-IR spectra of PSZ films after chemical treatments in an example 2 of the embodiment.
Figure 9:
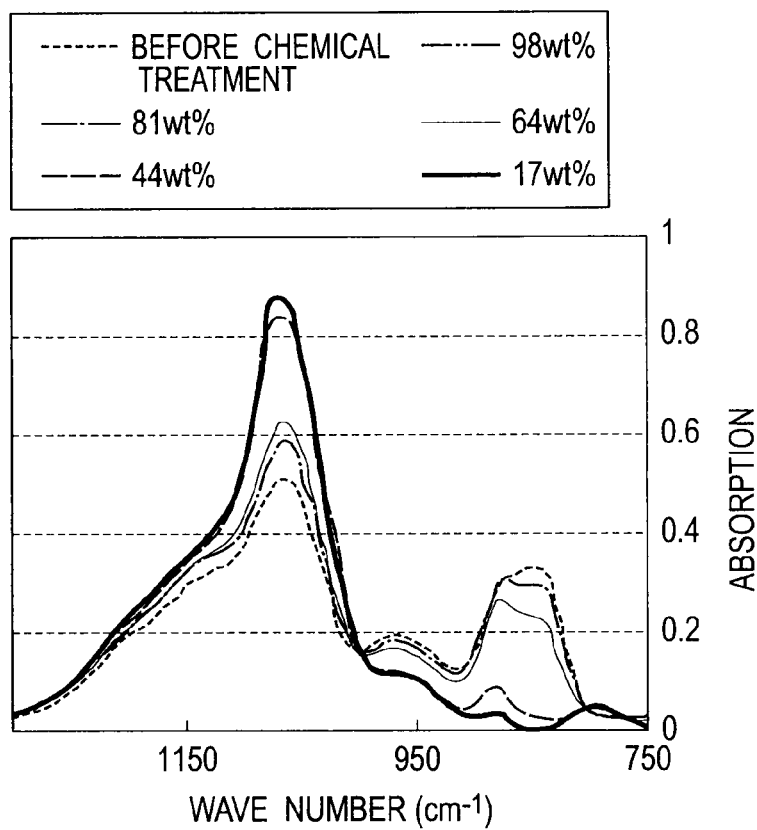
FIG. 9 is an enlarged view at a lower wave number side of the spectral diagram of FIG. 8.
Figure 10:
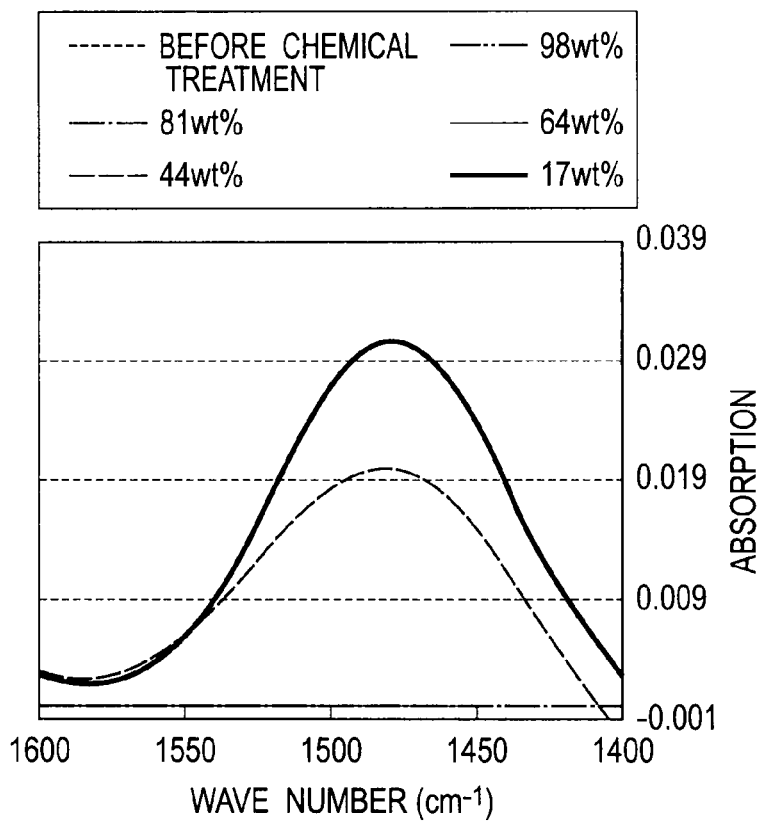
FIG. 10 is an enlarged view about a wave number of 1500 $cm^{-1}$ of the spectral diagram of FIG. 8.

FIG. 8 is a spectral diagram showing FT-IR spectra of PSZ films after chemical treatments in the embodiment example 2, FIG. 9, an enlarged view at a lower wave number side of the spectral diagram of FIG. 8, and FIG. 10, an enlarged view about a wave number of 1500 $cm^{-1}$ of the spectral diagram of FIG. 8.

As shown in FIG. 8 and FIG. 9, for use of treatment liquid of any concentration, there were observed, in comparison with states before chemical treatment, i.e., after oxidation treatment, a decrease at a peak from vibration of Si—N, and an increase at a peak from vibration of Si—O—Si, indicating a progress of transition from PSZ to silicon dioxide.

Further, as in FIG. 10, there were observed peaks from vibration of $NH_3$ appearing about a wave number of 1500 $cm^{-1}$. This is an indication of $NH_3$ let to be free by a hydrolytic reaction, and free $NH_3$ diffused outside the system and neutralized by sulfuric acid, with a resultant removal of N being an impurity in PSZ film.

Embodiment Example 3

For PSZ films formed on silicon substrates and oxidation-treated in a water vapor atmosphere in accordance with the procedures described, there were chemical treatments made thereto, using a sulfuric acid of 30% by weight for their treatment liquids containing acid, for a treatment period of 30 minutes, for treatment temperatures 25° C., 65° C., and 100° C., respectively.

Figure 11:
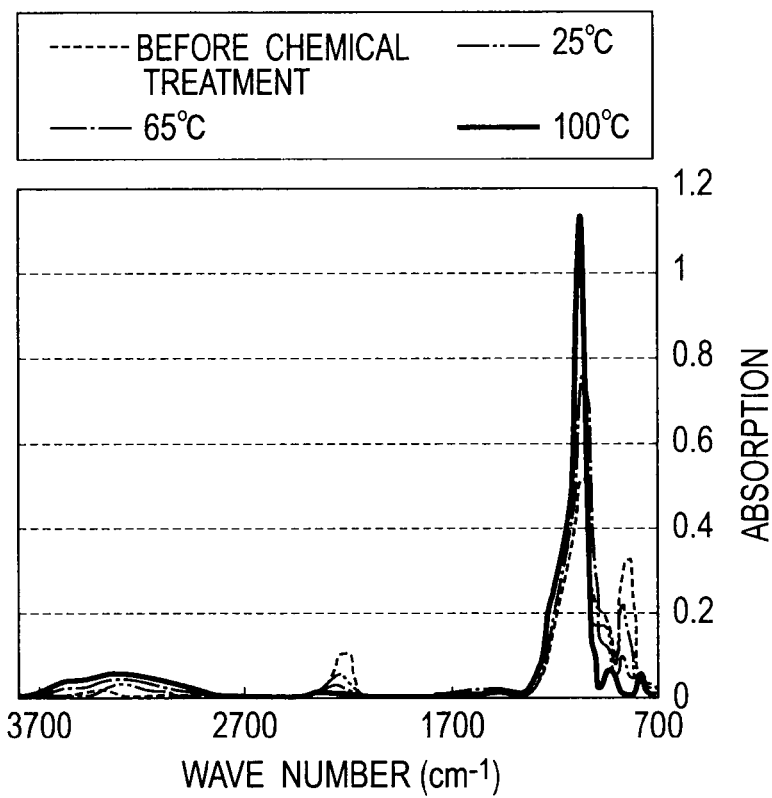
FIG. 11 is a spectral diagram showing FT-IR spectra of PSZ films after chemical treatments in an example 3 of the embodiment.
Figure 12:
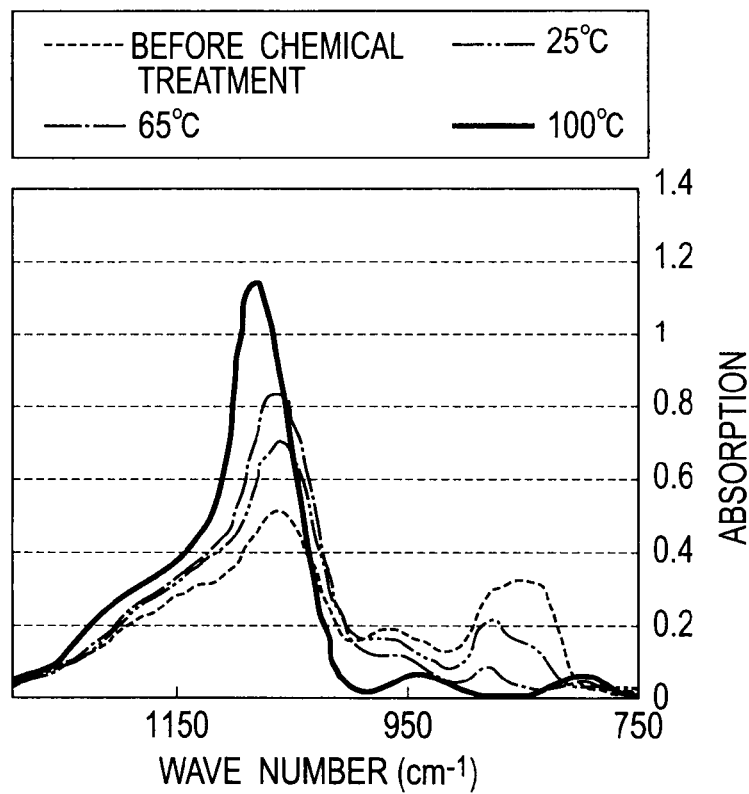
FIG. 12 is an enlarged view at a lower wave number side of the spectral diagram of FIG. 11.
Figure 13:
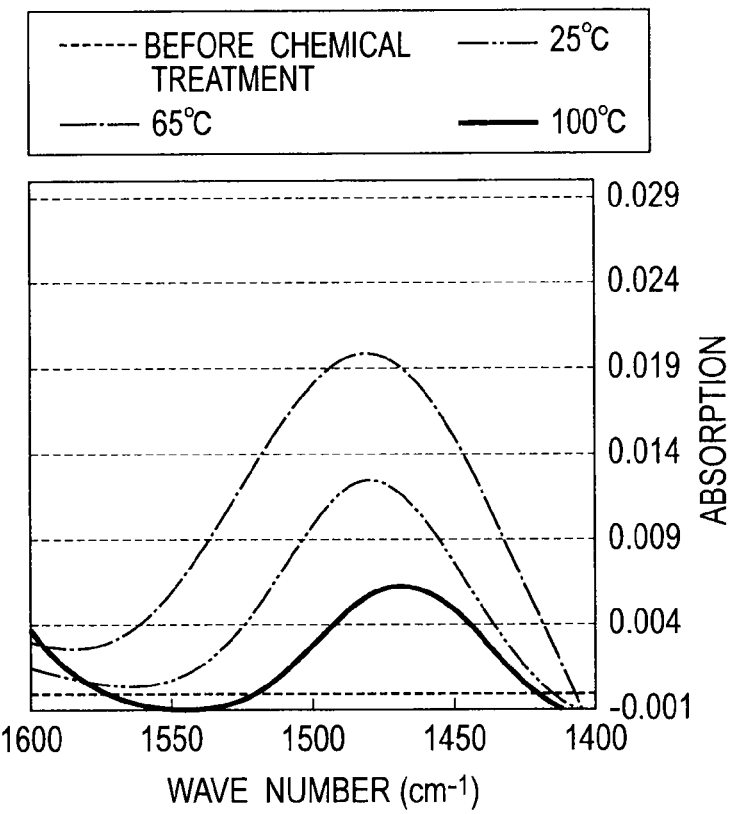
FIG. 13 is an enlarged view about a wave number of 1500 $cm^{-1}$ of the spectral diagram of FIG. 11.

FIG. 11 is a spectral diagram showing FT-IR spectra of PSZ films after chemical treatments in the embodiment example 3, FIG. 12, an enlarged view at a lower wave number side of the spectral diagram of FIG. 11, and FIG. 13, an enlarged view about a wave number of 1500 $cm^{-1}$ of the spectral diagram of FIG. 11.

As shown in FIG. 11 and FIG. 12, for use of treatment liquid of any concentration, there were observed, in comparison with states before chemical treatment, i.e., after oxidation treatment, a decrease at a peak from vibration of Si—N, and an increase at a peak from vibration of Si—O—Si, indicating a progress of transition from PSZ to silicon dioxide.

Further, as in FIG. 13, there were observed peaks from vibration of $NH_3$ appearing about a wave number of 1500 $cm^{-1}$, like the embodiment example 1. This is an indication of $NH_3$ let to be free by a hydrolytic reaction, and free $NH_3$ diffused outside the system and neutralized by sulfuric acid, with a resultant removal of N being an impurity in PSZ film. The peaks from vibration of $NH_3$ had intensities such that 100° C.<25° C.<65° C., indicating that the higher the temperature the more removed impurity N is.

Embodiment Example 4

For PSZ films formed on silicon substrates and oxidation-treated in a water vapor atmosphere in accordance with the procedures described, there were treatments made thereto by pure water (heated water) and followed by treatments using treatment liquids containing acids, which were two types being a treatment using a phosphoric acid of a concentration of 85% by weight, and a treatment using a sulfuric acid of a concentration of 30% by weight.

For the treatments by heated water, the treatment temperatures were 65° C., and the treatment periods, 30 minutes. For the treatment using phosphoric acid, the treatment temperature was 150° C., and the treatment period, 30 minutes. For the treatment using sulfuric acid, the treatment temperature was 65° C., and the treatment period, 30 minutes.

Figure 14:
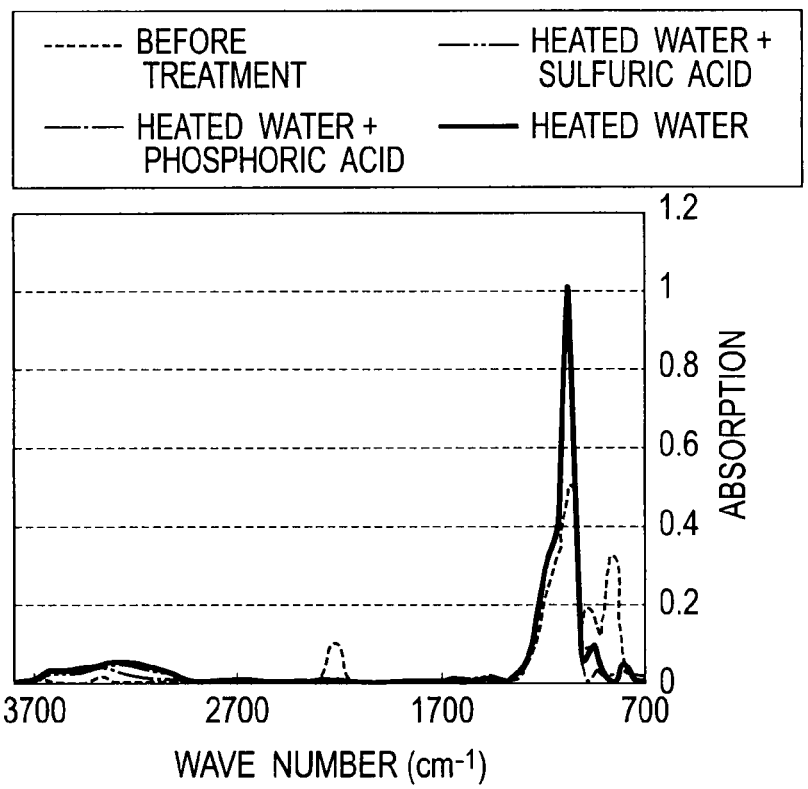
FIG. 14 is a spectral diagram showing FT-IR spectra of PSZ films after treatments in an example 4 of the embodiment.
Figure 15:
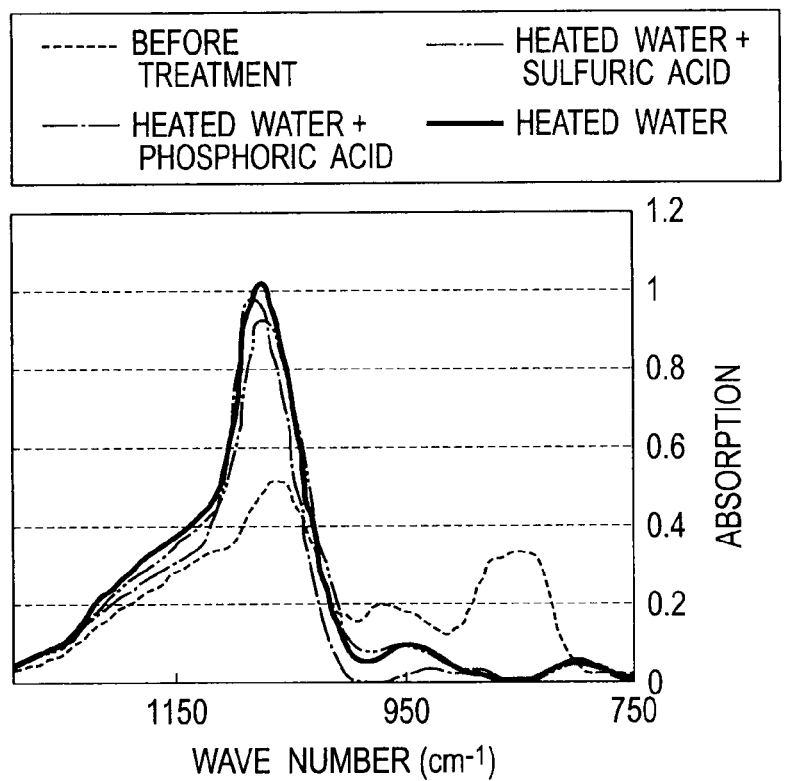
FIG. 15 is an enlarged view at a lower wave number side of the spectral diagram of FIG. 14.
Figure 16:
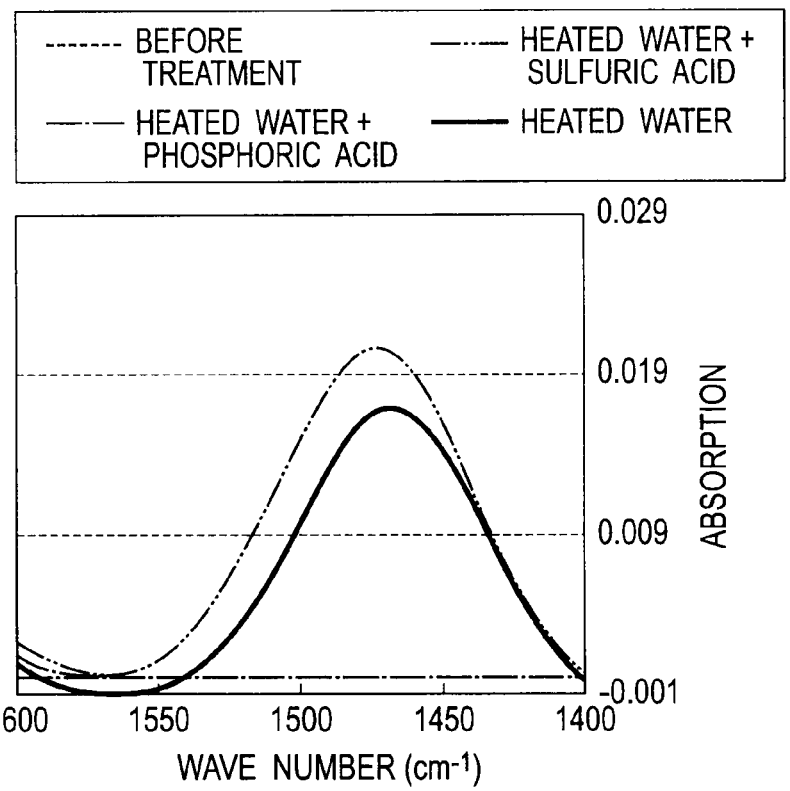
FIG. 16 is an enlarged view about a wave number of 1500 $cm^{-1}$ of the spectral diagram of FIG. 14.

FIG. 14 is a spectral diagram showing FT-IR spectra of PSZ films after chemical treatments in the embodiment example 4, FIG. 15, an enlarged view at a lower wave number side of the spectral diagram of FIG. 14, and FIG. 16, an enlarged view about a wave number of 1500 $cm^{-1}$ of the spectral diagram of FIG. 14.

As shown in FIG. 14 and FIG. 15, in each treatment, there were observed, in comparison with states before the treatment, i.e., after oxidation treatment, a decrease at a peak from vibration of Si—N, and an increase at a peak from vibration of Si—O—Si, indicating a progress of transition from PSZ to silicon dioxide.

Further, as in FIG. 16, there were observed peaks from vibration of $NH_3$ appearing about a wave number of 1500 $cm^{-1}$, like the embodiment example 1. This is an indication of $NH_3$ let to be free by a hydrolytic reaction, and free $NH_3$ diffused outside the system and neutralized by acid, with a resultant removal of N being an impurity in PSZ film.

Further, it can be caught that in comparison with simply making a sulfuric acid treatment (embodiment example 3), the treatment combination of heated water treatment and sulfuric acid treatment promoted the transition from PSZ to silicon dioxide, with an increased removal of impurity N.

Figure 17:
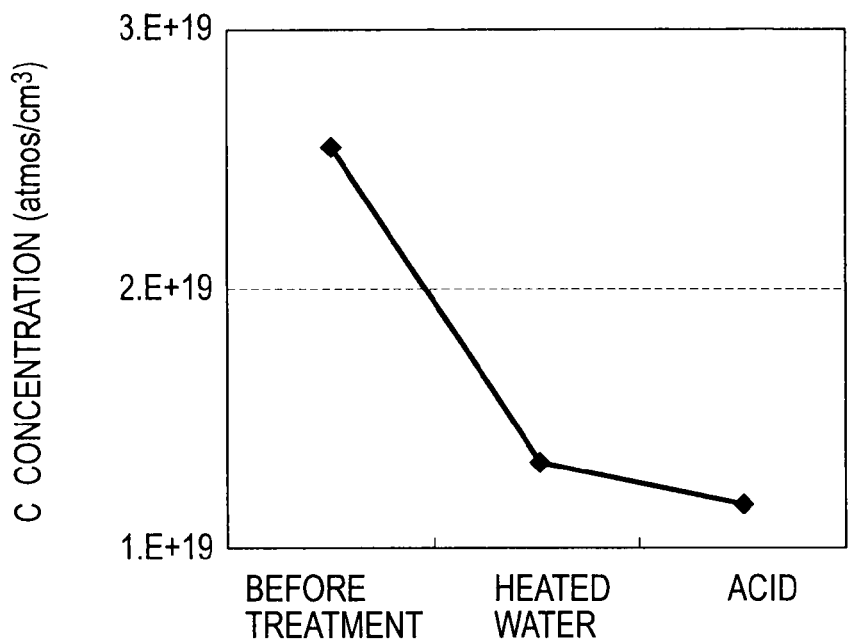
FIG. 17 is a diagram showing results of C concentration analyses after treatments in the example 4.

FIG. 17 is a diagram showing results of C concentration analyses after treatments in the example 4. It can be caught that in comparison with a state before treatment, there was a decreased concentration of C after heated water treatment, and a still decreased concentration of C after the treatment combination of heated water treatment and acid treatment.

Embodiment Example 5

For PSZ films formed on silicon substrates and oxidation-treated in a water vapor atmosphere in accordance with the procedures described, there were chemical treatments made thereto, using a hydrochloric acid for their treatment liquids containing acid. Treatment liquids used were three kinds prepared in advance to hydrochloric acid concentrations of 11%, 31%, and 35% by weight, respectively. Treatment temperatures were 65° C., and treatment periods, 30 minutes.

Figure 18:
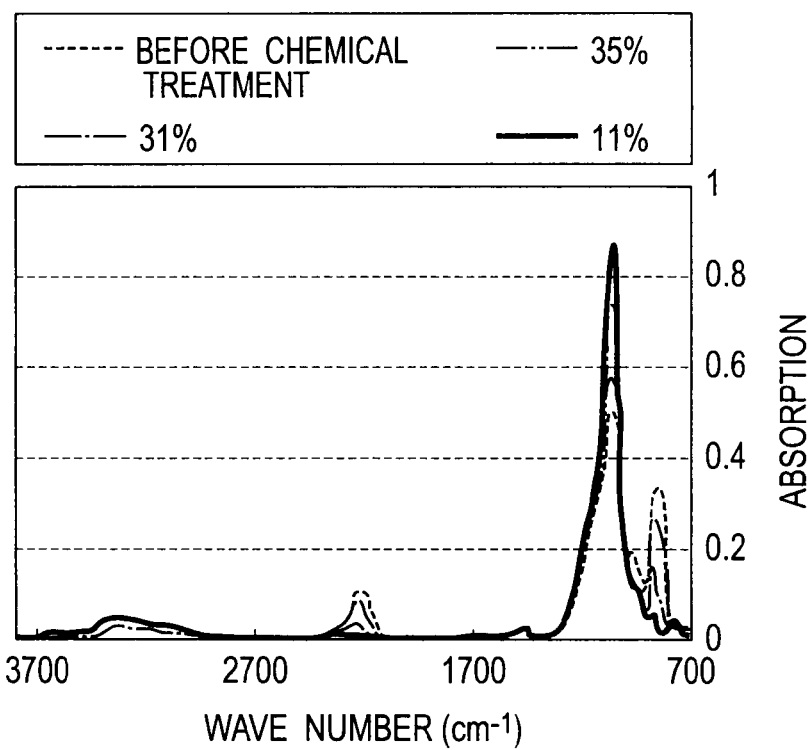
FIG. 18 is a spectral diagram showing FT-IR spectra of PSZ films after chemical treatments in an example 5 of the embodiment.
Figure 19:
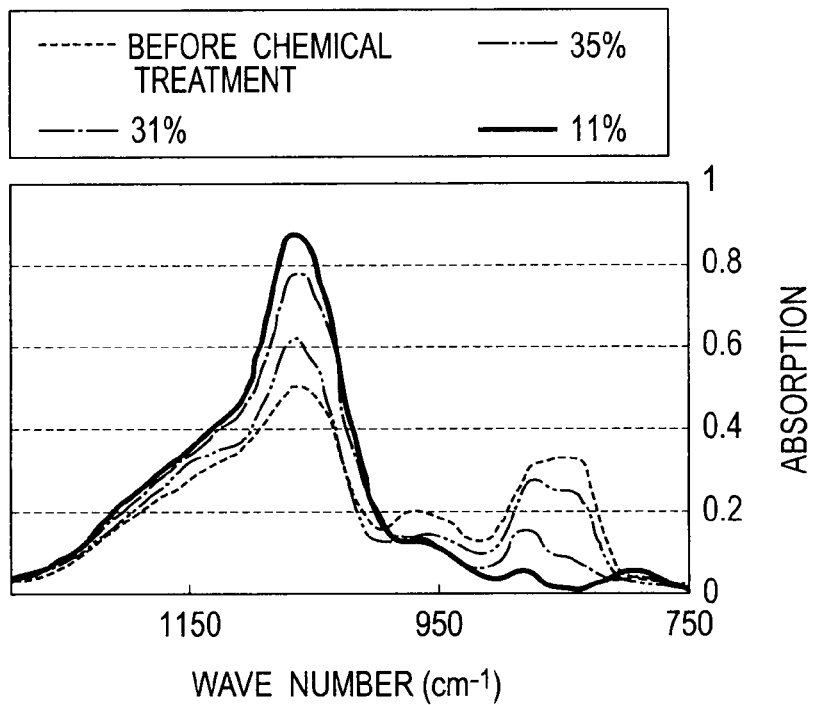
FIG. 19 is an enlarged view at a lower wave number side of the spectral diagram of FIG. 18.
Figure 20:
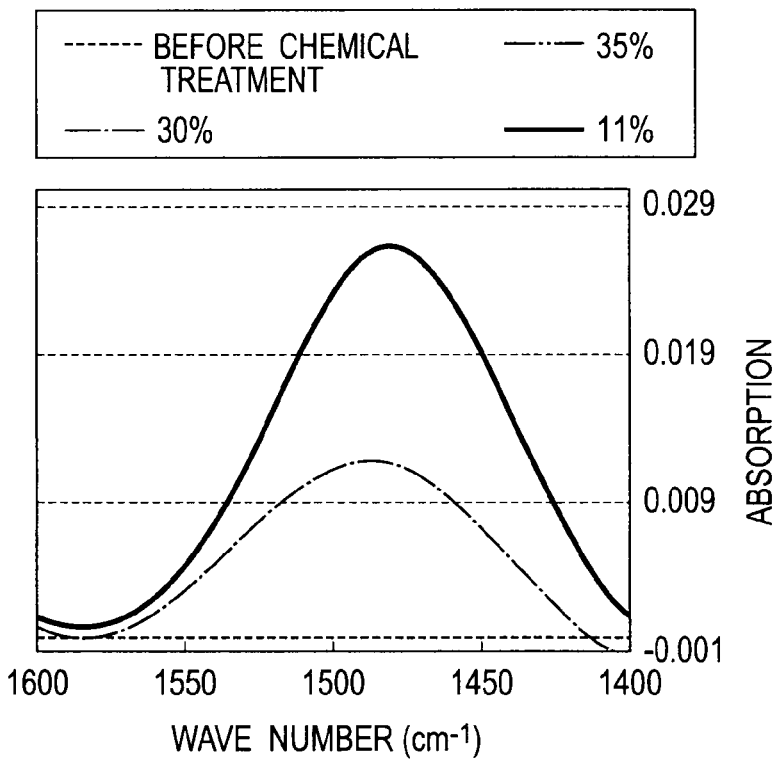
FIG. 20 is an enlarged view about a wave number of 1500 $cm^{-1}$ of the spectral diagram of FIG. 18.

FIG. 18 is a spectral diagram showing FT-IR spectra of PSZ films after chemical treatments in the embodiment example 5, FIG. 19, an enlarged view at a lower wave number side of the spectral diagram of FIG. 18, and FIG. 20, an enlarged view about a wave number of 1500 $cm^{-1}$ of the spectral diagram of FIG. 18.

As shown in FIG. 18 and FIG. 19, for use of treatment liquid of any concentration, there were observed, in comparison with states before chemical treatment, i.e., after oxidation treatment, a decrease at a peak from vibration of Si—N, and an increase at a peak from vibration of Si—O—Si, indicating a progress of transition from PSZ to silicon dioxide.

Further, as in FIG. 20, there were observed peaks from vibration of $NH_3$ appearing about a wave number of 1500 $cm^{-1}$, like the embodiment example 1. This is an indication of $NH_3$ let to be free by a hydrolytic reaction, and free $NH_3$ diffused outside the system and neutralized by hydrochloric acid, with a resultant removal of N being an impurity in PSZ film.

Embodiment Example 6

For PSZ films formed on silicon substrates and oxidation-treated in a water vapor atmosphere in accordance with the procedures described, there were chemical treatments made thereto, using tetramethylammonium hydroxide (TMAH) for their treatment liquids containing base. Treatment liquids used were four kinds prepared in advance to TMAH concentrations of 1%, 5%, 10%, and 25% by weight, respectively. Treatment temperatures were 65° C., and treatment periods, 30 minutes.

Figure 21:
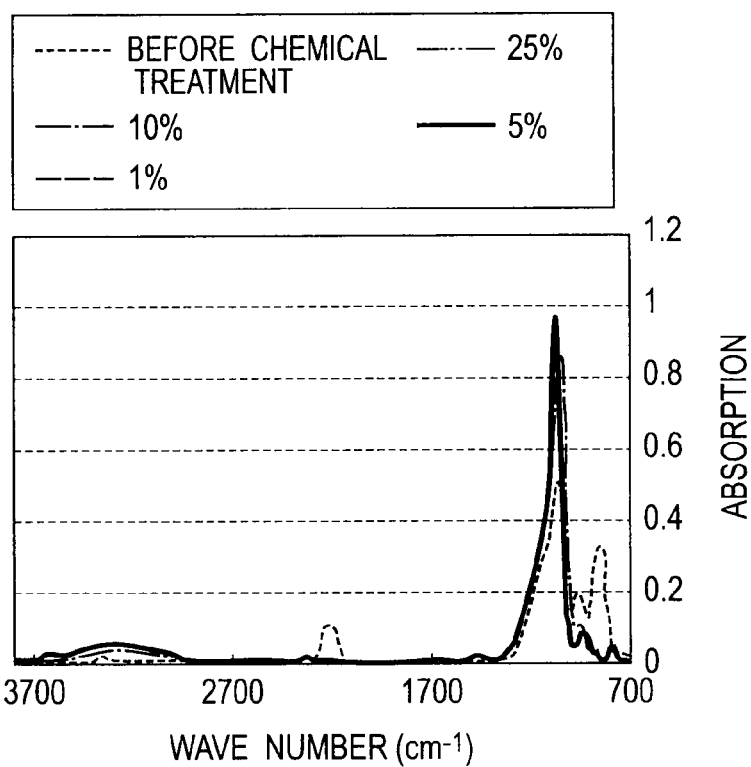
FIG. 21 is a spectral diagram showing FT-IR spectra of PSZ films after chemical treatments in an example 6 of the embodiment.
Figure 22:
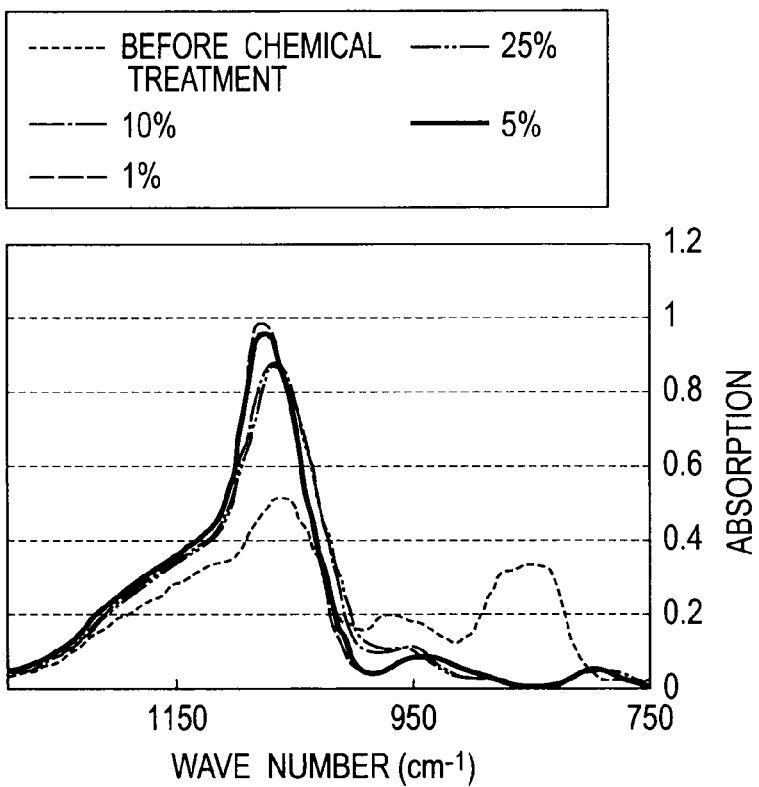
FIG. 22 is an enlarged view at a lower wave number side of the spectral diagram of FIG. 21.
Figure 23:
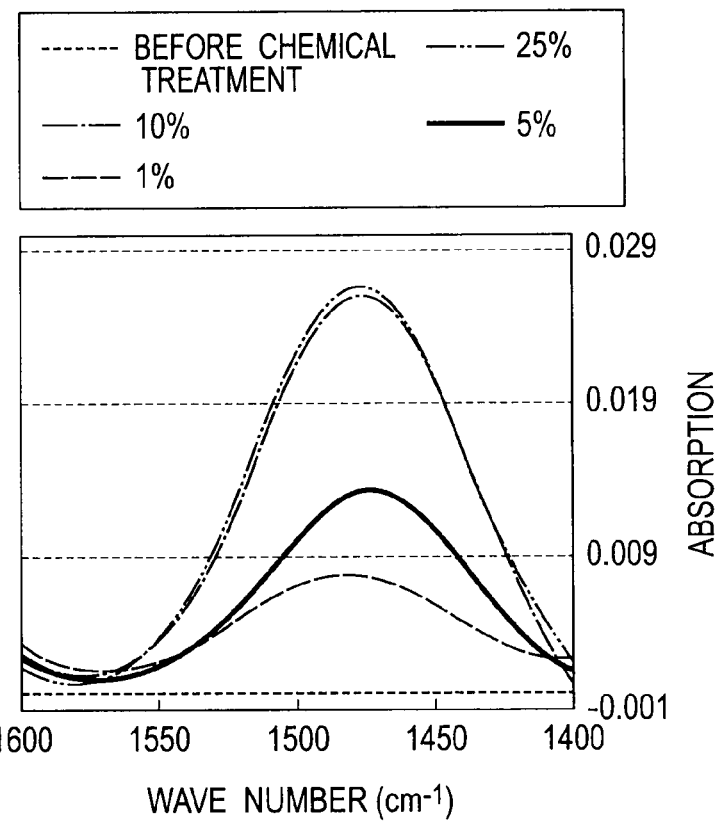
FIG. 23 is an enlarged view about a wave number of 1500 $cm^{-1}$ of the spectral diagram of FIG. 21.

FIG. 21 is a spectral diagram showing FT-IR spectra of PSZ films after chemical treatments in the embodiment example 6, FIG. 22, an enlarged view at a lower wave number side of the spectral diagram of FIG. 21, and FIG. 23, an enlarged view about a wave number of 1500 $cm^{-1}$ of the spectral diagram of FIG. 21.

As shown in FIG. 21 and FIG. 22, for use of treatment liquid of any concentration, there were observed, in comparison with states before chemical treatment, i.e., after oxidation treatment, a decrease at a peak from vibration of Si—N, and an increase at a peak from vibration of Si—O—Si, indicating a progress of transition from PSZ to silicon dioxide.

Further, as in FIG. 23, there were observed peaks from vibration of $NH_3$ appearing about a wave number of 1500 $cm^{-1}$, like the embodiment example 1. This is an indication of $NH_3$ let to be free by a hydrolytic reaction, and free $NH_3$ diffused outside the system, with a resultant removal of N being an impurity in PSZ film.

Embodiment Example 7

For PSZ films formed on silicon substrates and oxidation-treated in a water vapor atmosphere in accordance with the procedures described, there were chemical treatments made thereto, using ammonia water for their treatment liquids containing base. Treatment liquids used were five kinds prepared in advance to ammonia concentrations of 1%, 5%, 10%, 25%, and 29% by weight, respectively. Treatment temperatures were 65° C., and treatment periods, 30 minutes.

Figure 24:
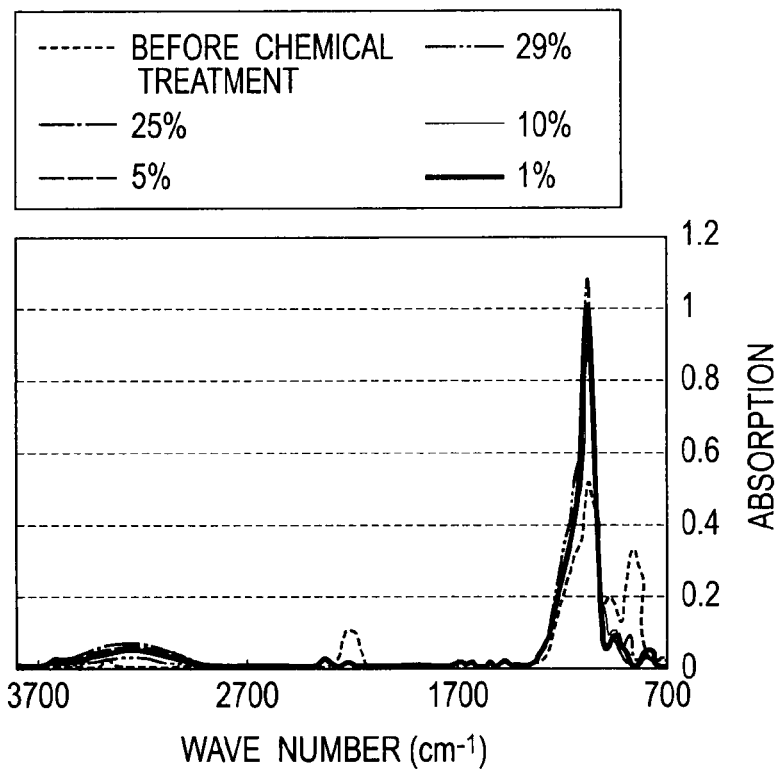
FIG. 24 is a spectral diagram showing FT-IR spectra of PSZ films after chemical treatments in an example 7 of the embodiment.
Figure 25:
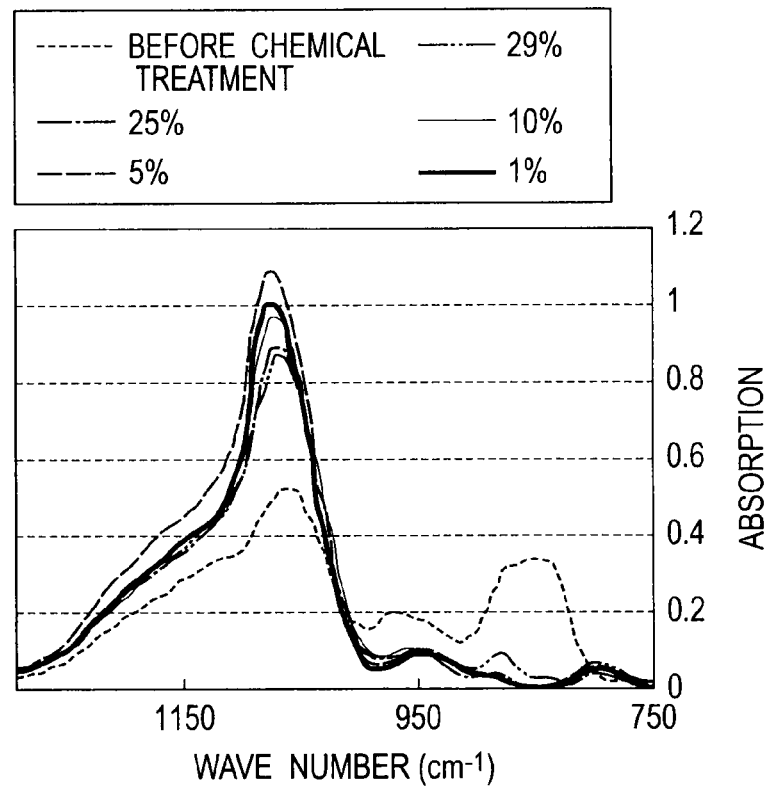
FIG. 25 is an enlarged view at a lower wave number side of the spectral diagram of FIG. 24.
Figure 26:
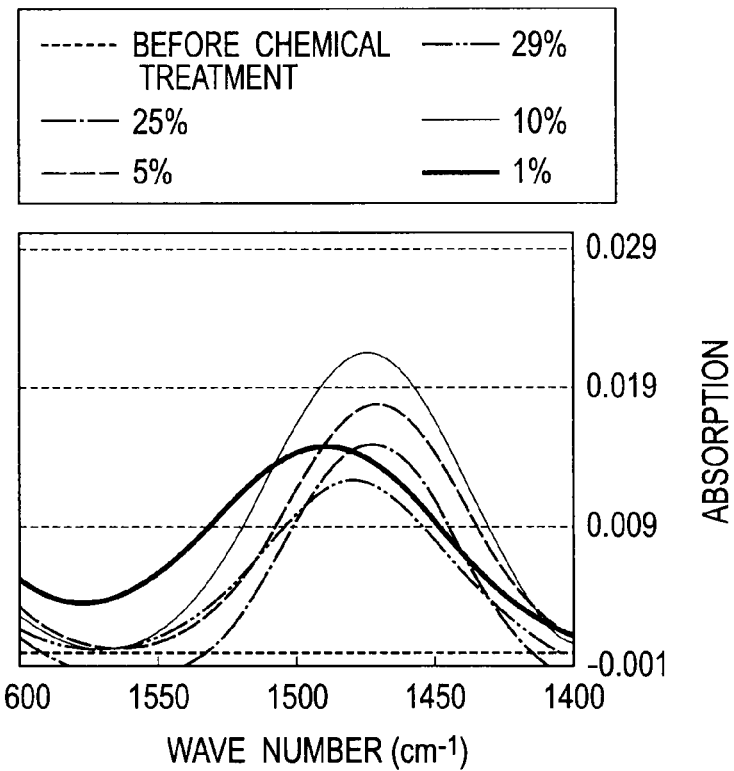
FIG. 26 is an enlarged view about a wave number of 1500 $cm^{-1}$ of the spectral diagram of FIG. 24.

FIG. 24 is a spectral diagram showing FT-IR spectra of PSZ films after chemical treatments in the embodiment example 7, FIG. 25, an enlarged view at a lower wave number side of the spectral diagram of FIG. 24, and FIG. 26, an enlarged view about a wave number of 1500 $cm^{-1}$ of the spectral diagram of FIG. 24.

As shown in FIG. 24 and FIG. 25, for use of treatment liquid of any concentration, there were observed, in comparison with states before chemical treatment, i.e., after oxidation treatment, a decrease at a peak from vibration of Si—N, and an increase at a peak from vibration of Si—O—Si, indicating a progress of transition from PSZ to silicon dioxide.

Further, as in FIG. 26, there were observed peaks from vibration of $NH_3$ appearing about a wave number of 1500 $cm^{-1}$, like the embodiment example 1. This is an indication of $NH_3$ let to be free by a hydrolytic reaction, and free $NH_3$ diffused outside the system, with a resultant removal of N being an impurity in PSZ film.

Embodiment Example 8

For PSZ films formed on silicon substrates and oxidation-treated in a water vapor atmosphere in accordance with the procedures described, there were chemical treatments made thereto, using choline aqueous solution (TMY) for their treatment liquids containing base. Treatment liquids used were two kinds prepared in advance to choline concentrations of 1%, and 5% by weight, respectively. Treatment temperatures were 65° C., and treatment periods, 30 minutes.

Figure 27:
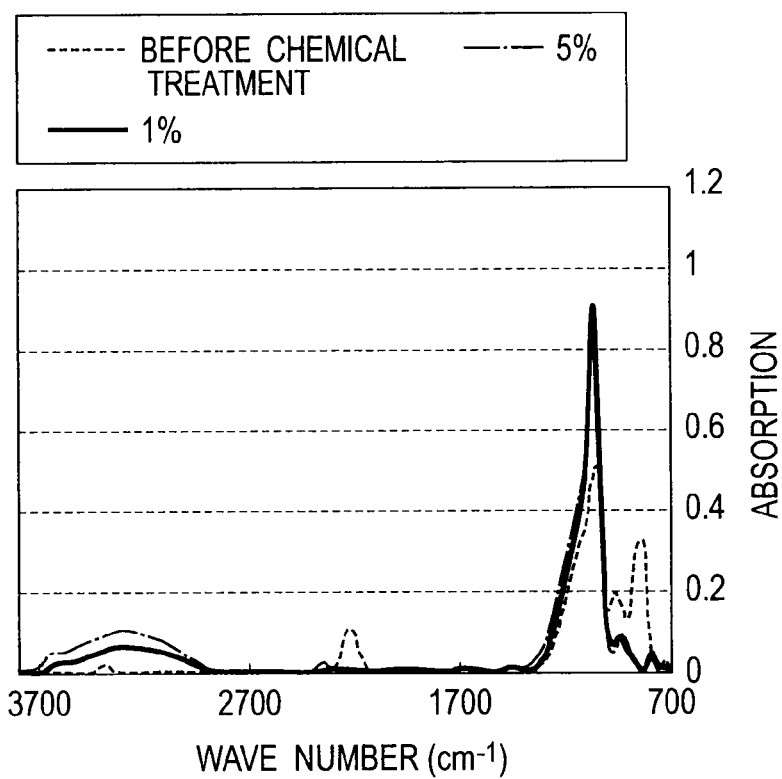
FIG. 27 is a spectral diagram showing FT-IR spectra of PSZ films after chemical treatments in an example 8 of the embodiment.
Figure 28:
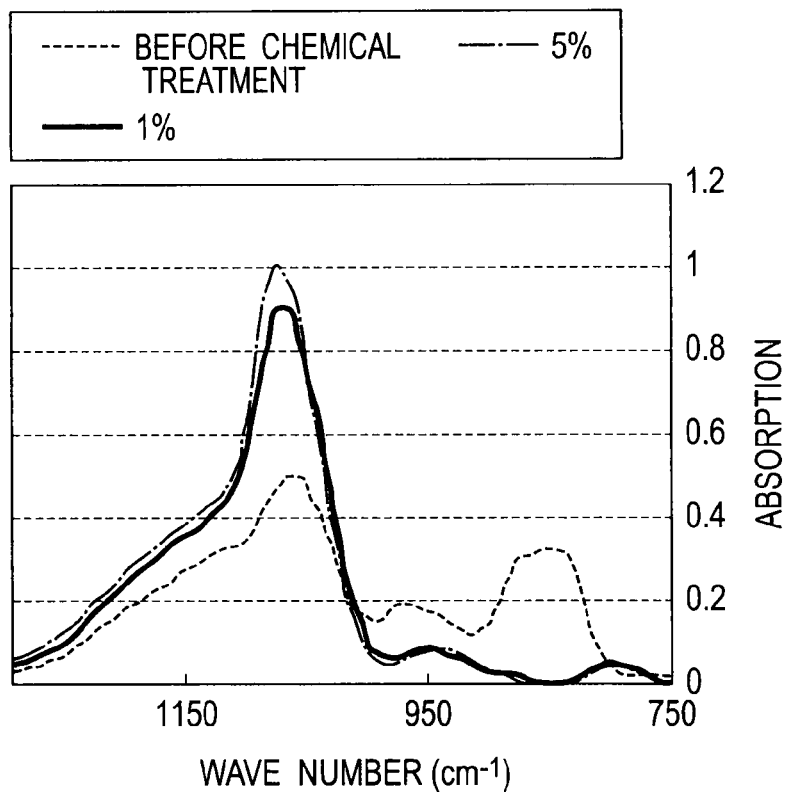
FIG. 28 is an enlarged view at a lower wave number side of the spectral diagram of FIG. 27.
Figure 29:
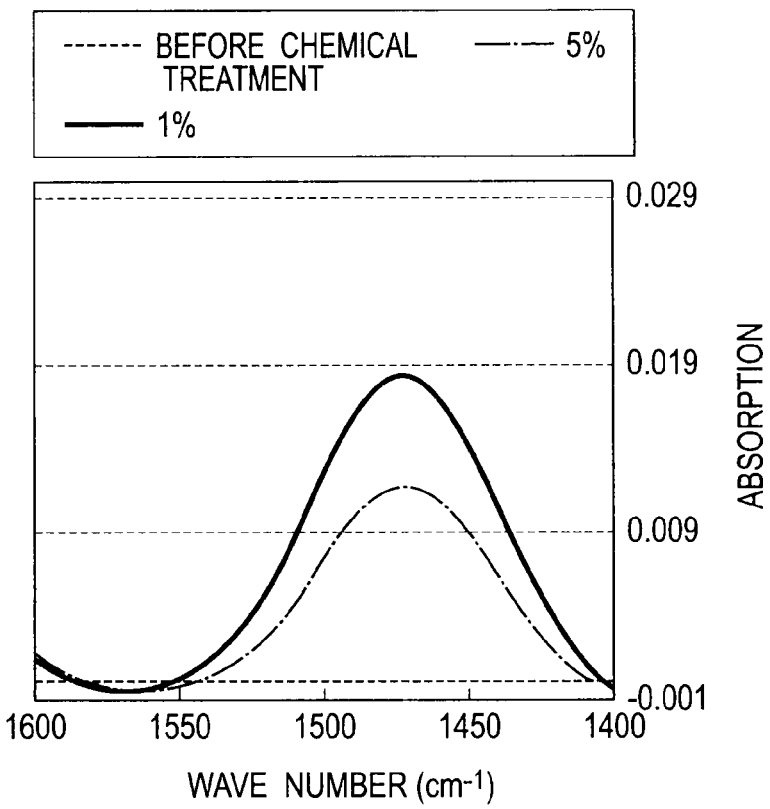
FIG. 29 is an enlarged view about a wave number of 1500 $cm^{-1}$ of the spectral diagram of FIG. 27.

FIG. 27 is a spectral diagram showing FT-IR spectra of PSZ films after chemical treatments in the embodiment example 8, FIG. 28, an enlarged view at a lower wave number side of the spectral diagram of FIG. 27, and FIG. 29, an enlarged view about a wave number of 1500 $cm^{-1}$ of the spectral diagram of FIG. 27.

As shown in FIG. 27 and FIG. 28, for use of treatment liquid of any concentration, there were observed, in comparison with states before chemical treatment, i.e., after oxidation treatment, a decrease at a peak from vibration of Si—N, and an increase at a peak from vibration of Si—O—Si, indicating a progress of transition from PSZ to silicon dioxide.

Further, as in FIG. 29, there were observed peaks from vibration of $NH_3$ appearing about a wave number of 1500 $cm^{-1}$, like the embodiment example 1. This is an indication of $NH_3$ let to be free by a hydrolytic reaction, and free $NH_3$ diffused outside the system, with a resultant removal of N being an impurity in PSZ film.

Embodiment Example 9

For PSZ films formed on silicon substrates and oxidation-treated in a water vapor atmosphere in accordance with the procedures described, there was a treatment made thereto by a treatment liquid containing acid and followed by a treatment using a treatment liquid containing base.

A sulfuric acid of a concentration of 98% by weight was used for the treatment liquid containing acid, and a TMY of a choline concentration of 0.1% by weight, for the treatment liquid containing base. For the sulfuric acid, the treatment period was 15 minutes, and the treatment temperature, 120° C. For the TMY, the treatment period was 5 minutes, and the treatment temperature, 65° C.

Figure 30:
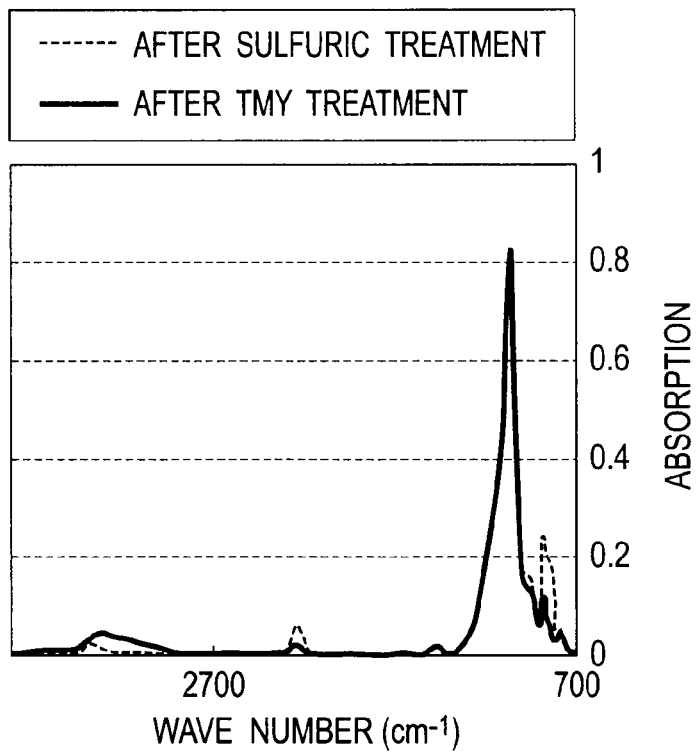
FIG. 30 is a spectral diagram showing FT-IR spectra of PSZ films after treatments in an example 9 of the embodiment.
Figure 31:
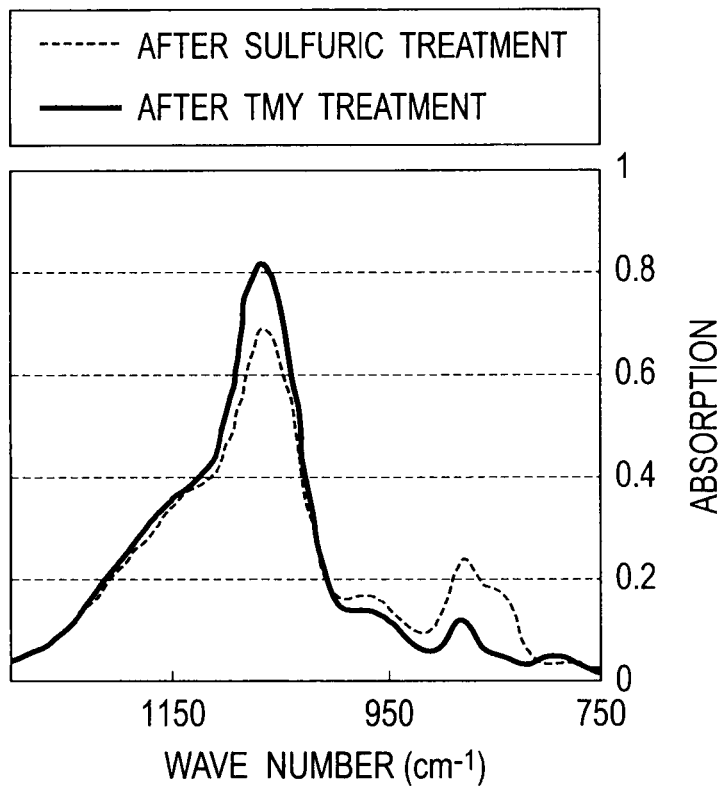
FIG. 31 is an enlarged view at a lower wave number side of the spectral diagram of FIG. 30.
Figure 32:
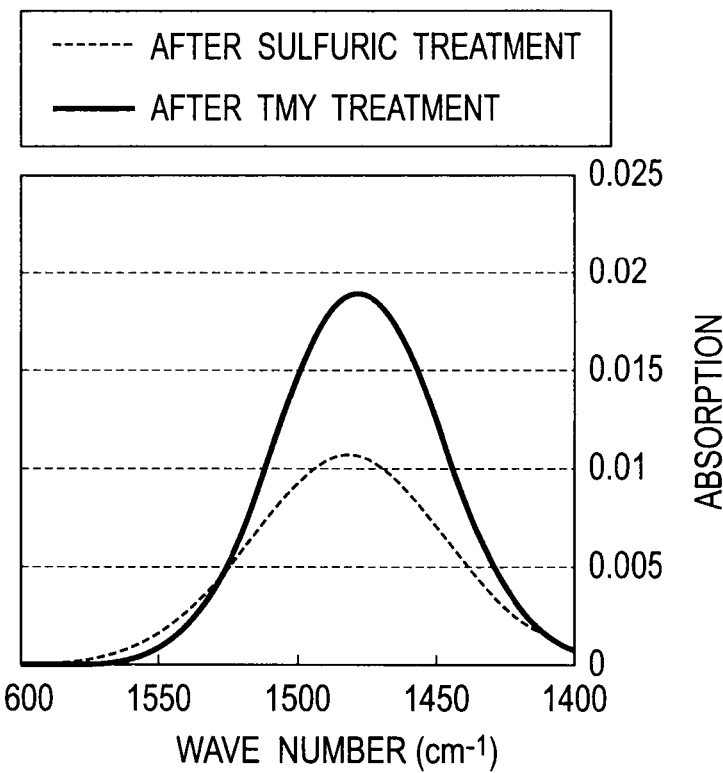
FIG. 32 is an enlarged view about a wave number of 1500 $cm^{-1}$ of the spectral diagram of FIG. 31.

FIG. 30 is a spectral diagram showing FT-IR spectra of PSZ films after treatments in the embodiment example 9, FIG. 31, an enlarged view at a lower wave number side of the spectral diagram of FIG. 30, and FIG. 32, an enlarged view about a wave number of 1500 $cm^{-1}$ of the spectral diagram of FIG. 31.

As shown in FIG. 30 and FIG. 31, after the TMY treatment, there were observed, relative to states after the sulfuric acid treatment, a decrease at a peak from vibration of Si—N, and an increase at a peak from vibration of Si—O—Si, indicating a progress of transition from PSZ to silicon dioxide.

Further, as in FIG. 32, there were observed peaks from vibration of $NH_3$ appearing about a wave number of 1500 $cm^{-1}$, like the embodiment example 1. This is an indication of $NH_3$ let to be free by a hydrolytic reaction, and free $NH_3$ diffused outside the system, with a resultant removal of N being an impurity in PSZ film.

It is noted that the present invention is in no way limited to the embodiment as described, and may be implemented with modified specific components within the spirit or scope of appended claims.

Further, disclosed components in the embodiment may be combined in an arbitrary manner to provide a variety of modifications. For instance, the embodiment may well have some of all components omitted.

In the embodiment described, a semiconductor substrate has an element isolation region formed thereon before having semiconductor elements formed thereon by known processes, as necessary, to provide a semiconductor device. According to the present invention, a semiconductor device may have semiconductor elements formed as necessary by known processes, before having an element isolation region formed therein. In this case also, respective techniques disclosed herein may well be applied.

It also is noted that the embodiment described encompasses a manufacturing method for semiconductor devices, covering a method of forming an element isolation region, and the present invention covers a manufacturing method for semiconductor devices including a method of forming an insulation region.

What is claimed is:

1. A manufacturing method for semiconductor devices, comprising:
    forming a trench in a semiconductor substrate;
    applying on the semiconductor substrate a polysilazane perhydride solution prepared by dispersing polysilazane perhydride in a solvent containing carbon, having a coated film formed thereon;
    heating the coated film, volatilizing solvent therein, forming a polysilazane film;
    soaking the polysilazane film in heated pure water;
    chemical-treating the polysilazane film, changing the polysilazane film to a silicon oxide film; and
    heating the silicon oxide film, densifying the silicon oxide film.

2. The manufacturing method for semiconductor devices according to claim 1, wherein the chemical-treating comprises soaking the polysilazane film in a treatment liquid containing water.

3. The manufacturing method for semiconductor devices according to claim 1, wherein the chemical-treating comprises soaking the polysilazane film in a treatment liquid containing an acid and water, and soaking the polysilazane film in a treatment liquid containing a base and water.

4. The manufacturing method for semiconductor devices according to claim 1, wherein the forming the polysilazane film is followed by heating the polysilazane film in an atmosphere containing water vapor.

5. The manufacturing method for semiconductor devices according to claim 2, wherein the treatment liquid contains an acid or a base.

6. The manufacturing method for semiconductor devices according to claim 2, wherein the treatment liquid contains a phosphoric acid, a sulfuric acid, or a hydrochloric acid.

7. The manufacturing method for semiconductor devices according to claim 2, wherein the treatment liquid contains tetramethylammonium hydroxide, ammonia, or choline.

* * * * *